United States Patent
Goktepeli et al.

(10) Patent No.: US 9,362,492 B2
(45) Date of Patent: Jun. 7, 2016

(54) INTEGRATED PHASE CHANGE SWITCH

(71) Applicant: QUALCOMM SWITCH CORP., San Diego, CA (US)

(72) Inventors: Sinan Goktepeli, San Diego, CA (US); Michael A. Stuber, Rancho Santa Fe, CA (US)

(73) Assignee: QUALCOMM SWITCH CORP., San Diego, CA (US)

( * ) Notice: Subject to any disclaimer, the term of this patent is extended or adjusted under 35 U.S.C. 154(b) by 0 days.

(21) Appl. No.: 14/468,074

(22) Filed: Aug. 25, 2014

(65) Prior Publication Data

US 2016/0056373 A1    Feb. 25, 2016

(51) Int. Cl.
*H01L 27/24* (2006.01)
*H01L 45/00* (2006.01)

(52) U.S. Cl.
CPC ............ *H01L 45/06* (2013.01); *H01L 27/2436* (2013.01); *H01L 45/126* (2013.01); *H01L 45/1608* (2013.01); *H01L 45/1675* (2013.01)

(58) Field of Classification Search
CPC .............. H01L 2745/05; H01L 45/125; H01L 45/1608; H01L 45/1675; H01L 27/2436; H01L 45/1068; H01L 45/06; H01L 45/126; H01L 27/2409; H01L 45/1206; H01L 45/1253; H01L 45/16

See application file for complete search history.

(56) References Cited

U.S. PATENT DOCUMENTS

| | | | |
|---|---|---|---|
| 6,448,576 B1 | 9/2002 | Davis et al. | |
| 6,969,869 B2 | 11/2005 | Hudgens et al. | |
| 7,378,895 B2 | 5/2008 | Hsu et al. | |
| 7,388,273 B2 | 6/2008 | Burr et al. | |
| 7,394,089 B2 | 7/2008 | Doyle et al. | |
| 7,633,079 B2 | 12/2009 | Chen et al. | |
| 7,634,248 B2 | 12/2009 | Xu et al. | |
| 7,880,123 B2 | 2/2011 | Kim et al. | |
| 7,945,868 B2 | 5/2011 | Pileggi et al. | |
| 8,513,576 B2 | 8/2013 | Kim et al. | |
| 2006/0246712 A1 | 11/2006 | Kim et al. | |
| 2008/0029753 A1 | 2/2008 | Xu et al. | |
| 2010/0203672 A1* | 8/2010 | Eun ..................... | H01L 27/2409 438/102 |
| 2011/0155986 A1 | 6/2011 | Kim et al. | |
| 2014/0038379 A1 | 2/2014 | Kim et al. | |
| 2014/0191181 A1* | 7/2014 | Moon .................. | H01L 27/2409 257/4 |

OTHER PUBLICATIONS

Chen et al., Programmable via Using Indirectly Heated Phase-Change Switch for Reconfigurable Logic Applications, IBM T.J. Waston Res. Center, Electron Device Letters, IEEE, Jan. 2008, vol. 29, Issue 1, pp. 131-133.

(Continued)

*Primary Examiner* — Jasmine Clark
(74) *Attorney, Agent, or Firm* — Haynes and Boone, LLP

(57) ABSTRACT

Various methods and devices that involve phase change material (PCM) switches are disclosed. An exemplary integrated circuit comprises an active layer with a plurality of field effect transistor (FET) channels for a plurality of FETs. The integrated circuit also comprises an interconnect layer comprising a plurality of conductive interconnects. The plurality of conductive interconnects couple the plurality of field effect transistors. The integrated circuit also comprises an insulator layer covering at least a portion of the interconnect layer. The integrated circuit also comprises a channel of a radio-frequency (RF) PCM switch. The channel of the RF PCM switch is formed on the insulator layer.

19 Claims, 13 Drawing Sheets

(56) References Cited

OTHER PUBLICATIONS

Chua et al., Low Resistance, High Dynamic Range Reconfigurable Phase Change Switch for Radio Frequency Applications, Appl. Phys. Lett., Nov. 2010, vol. 97, No. 18, pp. 183506-1-183506-3.

Crunteanu et al., Out-of-Plane and Inline RF Switches based on Ge2Sb2Te5 Phase Change Material, XLIM Research Institute, IEEE Int. Microwave Symp. Jun. 2014.

El-Hinnawy et al., A 7.3 THz Cut-Off Frequency, Inline, Chalcogenide Phase-Change RF Switch Using an Independent Resistive Heater for Thermal Actuatio, IEEE Compound Semiconductor Integrated Circuit Symposium (CSICS), Oct. 2013, pp. 1-4.

El-Hinnawy et al., A Four-Terminal, Inline, Chalcogenide Phase-Change RF Switch Using an Independent Resistive Heater for Thermal Actuation, Electron Device Letters, IEEE, Oct. 2013, vol. 34, Issue 10, pp. 1313-1315.

Hillman et al., An Ultra-low Loss Millimeter-wave Solid State Switch Technology Based on the Metal-Insulator-Transistion of Vandium Dioxide, IEEE Int. Microwave Symp. Jun. 2014.

Lo et al., Three-Terminal Probe Reconfigurable Phase-Change Material Switches, IEEE Transactions on Electron Devices, Jan. 2010, vol. 57, No. 1, pp. 312-320.

Moon et al., Development toward High-Power Sub-1-ohm DC-67 GHz RF Switches using Phase Chagne Materials for Reconfigurable RF Front-end, IEEE Int. Microwave Symp. Jun. 2014.

Shim et al., RF Switches using Phase Change Materials, MEMS 2013, Taipei, Taiwan, Jan. 20-24, 2013, pp. 237-240.

Shim, Non-Linearity Analysis of RF Ohmic Switches Based on Phase Change Materials, IEEE Electron Device Letters, Mar. 2014.

Wang et al., Directly Heated Four-Terminal Phase Change Switches, IEEE Int. Microwave Symp. Apr. 2014.

\* cited by examiner

100

FIG. 3
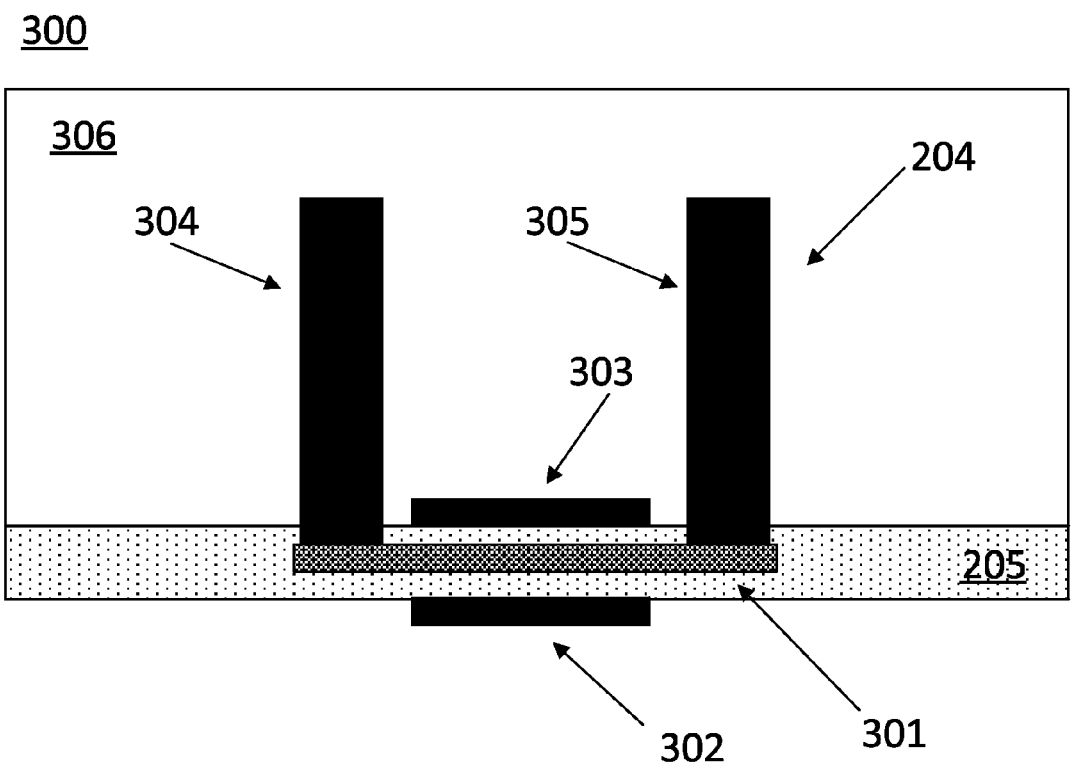
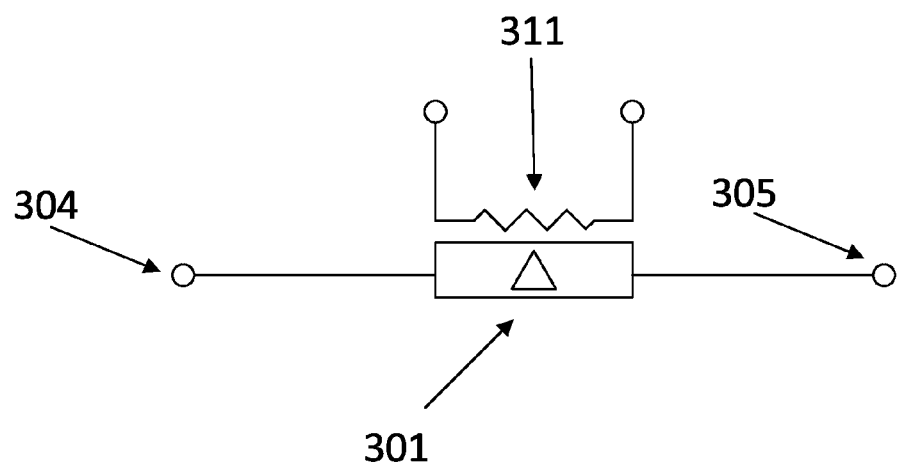

400

800

900

1100

1200

INTEGRATED PHASE CHANGE SWITCH

BACKGROUND OF THE INVENTION

Radio frequency switch transistors are required to carry large currents and switch at high speeds. In certain applications, the switches need to operate in the hundreds of gigahertz (GHz) range and handle upwards of one watt of input power in a linear fashion. Traditional transistor technologies such as metal-oxide-semiconductor (MOS) transistors fabricated using doped silicon are able to perform under these operating requirements, but generally consume a large area of a semiconductor wafer and often require exotic processing steps to perform under such stringent conditions.

FIG. 1 illustrates a high level view of a single pole four throw (SP4T) switch 100 implemented using MOS transistors. A main signal bus 101 is independently coupled to four different throws 102-105 via different transistor arrays 106. The transistor arrays 106 comprise multiple fingers of a single transistor. The arrays are relatively large features for an integrated circuit because the width of the transistors needs to be large enough to decrease the on resistance of the transistor to a near negligible level. For comparison, current digital transistors implemented using MOS processing have widths that are on the order of nanometers while the width of the transistor in each transistor array 106 is on the order of millimeters. The same type of transistor technology is therefore being used to form devices that differ in size by a factor of more than a million.

In addition to the strain placed on a transistor technology that has to perform in such widely divergent applications, the size of wafer real estate that is consumed by these transistors weighs heavily on the overall cost of the integrated circuit on which the switch is fabricated. In a typical implementation, the width of each array 106 can be on the order of one millimeter while the height of each array 106 can be on the order of 0.3 millimeters. While these dimensions are not necessarily immense as compared to the die size of certain application specific integrated circuits, any decrease in die array contributes directly to the potential profitability of an integrated circuit design.

SUMMARY OF INVENTION

An integrated circuit is disclosed that comprises an active layer comprising a plurality of field effect transistor (FET) channels for a plurality of FETs. The integrated circuit also comprises an interconnect layer comprising a plurality of conductive interconnects. The plurality of conductive interconnects couple the plurality of field effect transistors. The integrated circuit also comprises an insulator layer covering at least a portion of the interconnect layer. The integrated circuit also comprises a channel of a radio-frequency (RF) phase change material (PCM) switch. The channel of the RF PCM switch is formed on the insulator layer.

A monolithic integrated circuit is disclosed comprising a semiconductor substrate that has been doped to form a plurality of active regions for a plurality of FETs. The monolithic integrated circuit also comprises an RF PCM switch having a PCM channel, a first contact, and a second contact. The monolithic integrated circuit also comprises an interconnect layer located between the PCM channel and the semiconductor substrate.

A process for fabricating an integrated circuit is disclosed comprising forming a plurality of FET channels in a layer of semiconductor material. The process also comprises forming a interconnect layer comprising a plurality of conductive interconnects. The plurality of conductive interconnects are formed to couple the plurality of FETs. The process also comprises depositing an insulator layer over at least a portion of the interconnect layer. The process also comprises forming a channel of an RF PCM switch on the insulator layer using a first mask.

BRIEF DESCRIPTION OF THE DRAWINGS

FIG. 3 illustrates a cross section and schematic of an indirectly heated phase change material switch that is in accordance with embodiments of the present invention.

DETAILED DESCRIPTION OF THE EMBODIMENTS

Figure 1:
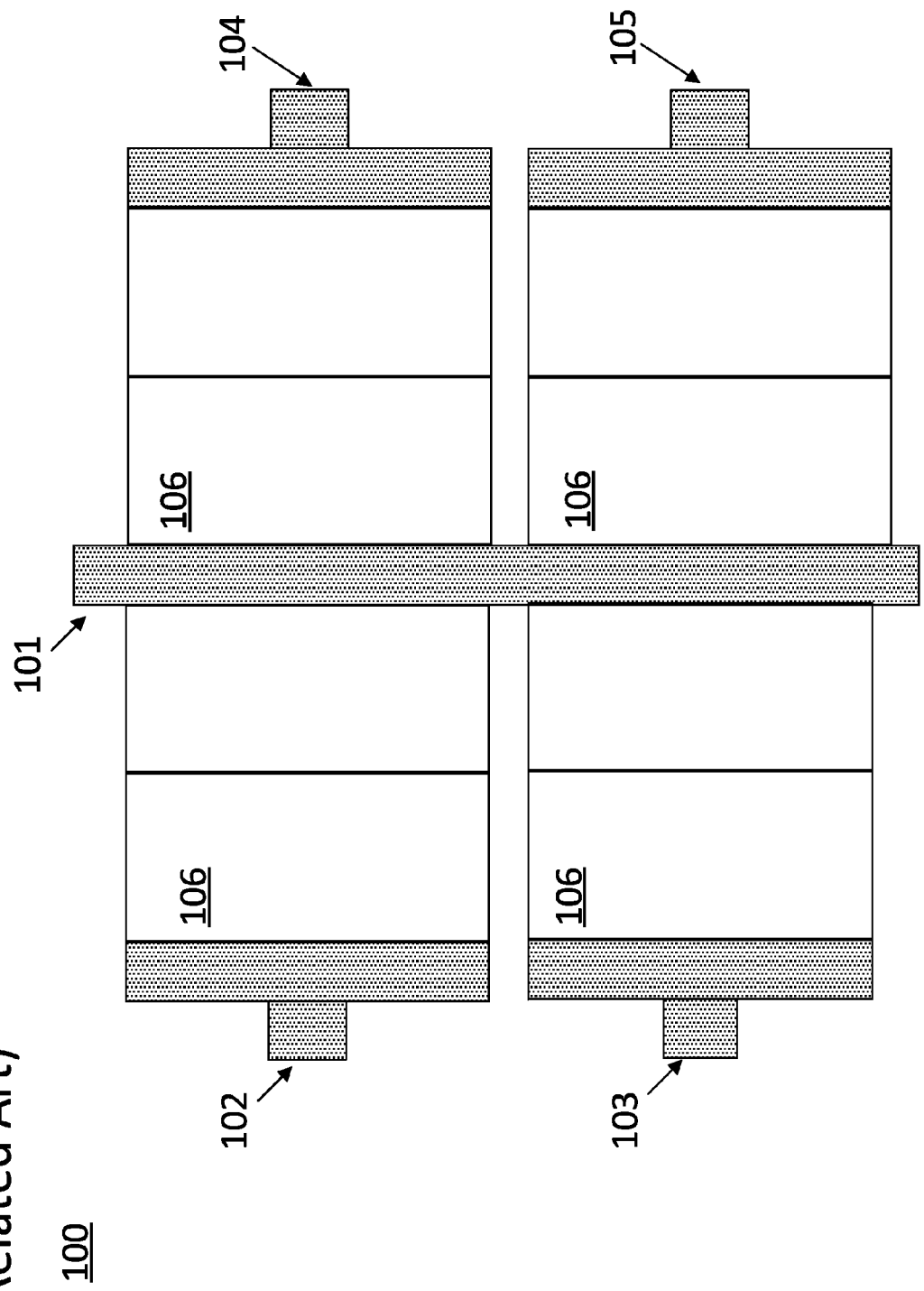
FIG. 1 illustrates an SP4T switch fabricated using standard transistors that is in accordance with the related art.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Current mainstream transistor technologies are beginning to fall behind the demands placed on them by radio frequency (RF) applications. The transistors need to handle increasingly larger currents at increasingly higher speeds. At the same time, they need to process signals in a linear fashion in order to preserve their ability to accurately transmit information through a modern communications network. Transistor technologies such as complementary metal-oxide-semiconductor (CMOS) field effect transistors (FETs) can be used in RF applications, but they can exhibit relatively high on-state resistance and introduce non-linear parasitic capacitance to the communication system. Although the on-state resistance of these transistors can be decreased by increasing the area of the transistor, this in turn increases both the cost of the switch and the parasitic capacitance.

RF phase change material (PCM) switches offer a promising alternative to current mainstream transistor technologies. PCM switches are characterized by a channel of PCM that can alter its physical configuration between an amorphous state and a crystalline state. These different states of physical configuration are referred to as phases. PCMs provide an appealing option for switch applications because they can be electrically nonconductive in the amorphous state and highly electrically conductive in the crystalline state. In certain cases, the PCM channel will transition between states in response to the introduction of heat. In particular, certain PCMs will alter their phase when heated in accordance with a given heat duration and intensity profile and will retain their altered properties when cooled from the heated state. These PCMs will then revert back to their original phase when heated in accordance with an alternative heat duration and intensity profile.

Many PCM materials, examples of which are discussed in more detail below, have the potential to outperform current mainstream transistor technologies when applied to RF applications. For example, PCM switches have the potential to provide a far lower on state resistance as compared to a CMOS FET of the same size. PCM switches also do not exhibit the same degree of nonlinear parasitic capacitance when compared to certain mainstream transistor technologies because they do not exhibit voltage dependent capacitances due to the effect of large bias voltages on carriers in the channel.

Integrating a PCM switch process with a CMOS process flow would provide certain benefits. CMOS FET technology is relatively inexpensive and the characteristics of CMOS FETs are well known and easy to design for. In addition, the benefits of PCM switches do not apply as sharply over CMOS FETs in lower power and/or lower frequency applications. Therefore, the auxiliary circuitry associated with the RF switches, such as control circuits, can still be beneficially implemented using CMOS FET technology. However, for these benefits to be realized, the CMOS FETs need to be integrated into the same integrated circuit as the PCM switches. If not, the control circuits and other auxiliary circuitry will need to be produced on a second wafer, and the cost of an additional wafer generally does not offset the cost savings associated with making a first wafer smaller or subject to less exotic processing constraints.

Figure 2:
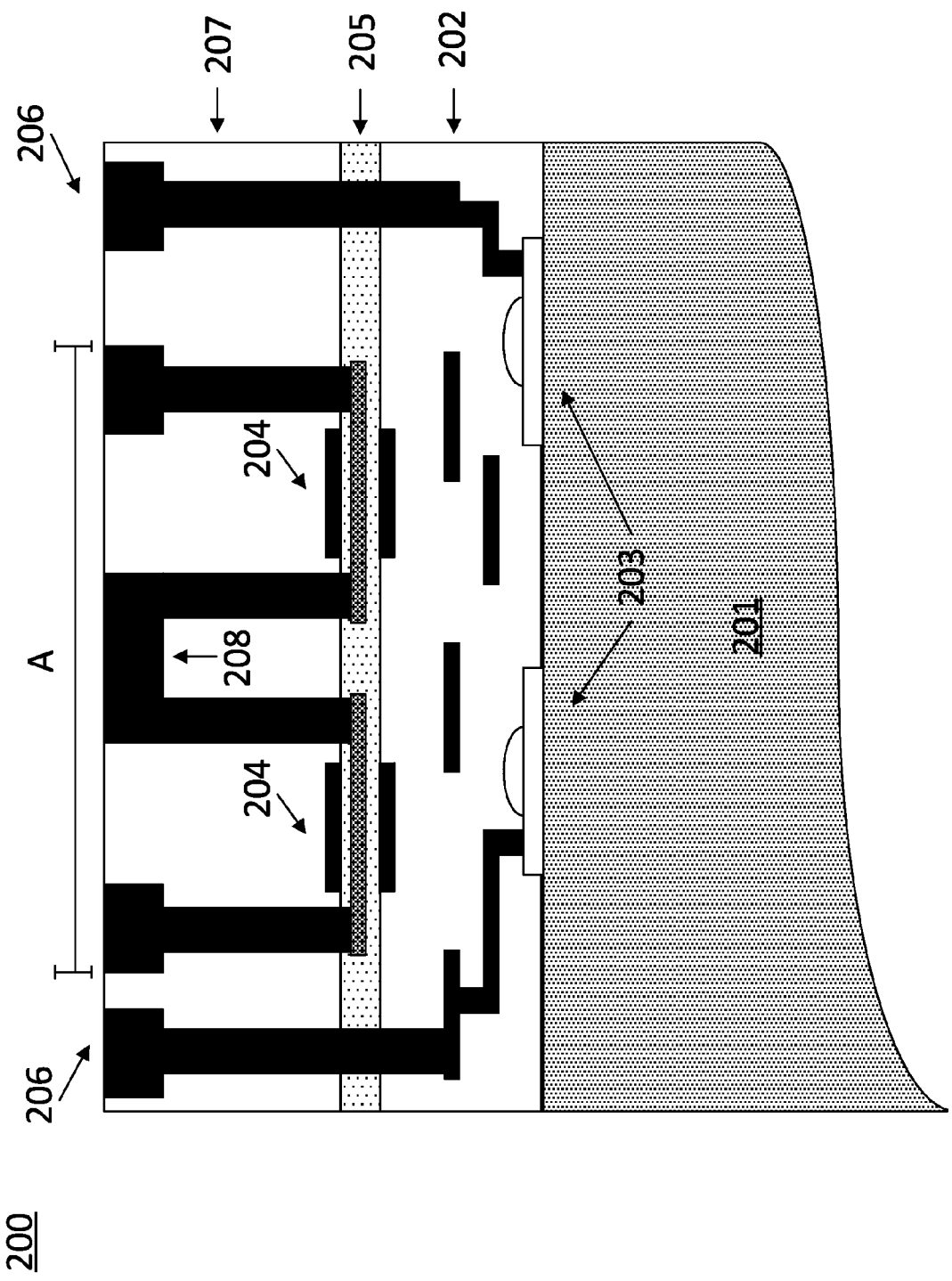
FIG. 2 illustrates a cross section of an integrated circuit having an integrated phase change material switch that is in accordance with embodiments of the present invention.

FIG. 2 illustrates an integrated circuit 200. Integrated circuit 200 could be a monolithic integrated circuit or it could be made up of multiple layers that were produced separately and then bonded together. Integrated circuit 200 includes a substrate 201 and an active layer 202 comprising a plurality of transistors 203. Substrate 201 can be an insulator such as aluminum oxide or a semiconductor material such as silicon. In the latter case, active layer 202 can be formed using substrate 201 via the introduction of dopants into substrate 201 to form a plurality of active regions for the plurality of transistors 203. Additionally, an insulator may be formed between active layer 202 and substrate 201 to form a semiconductor-on-insulator (SOI) structure.

The transistors in the active layer can be manufactured in accordance with any transistor fabrication technology. For example, the transistors could be CMOS FETs manufactured in accordance with standard CMOS processing. In this example, active layer 202 would comprise a plurality of FET channels. Certain benefits accrue to this approach in that, due to its prevalence and wide spread availability, the cost of standard CMOS processing is relatively low compared to other transistor manufacturing technologies.

Active layer 202 can also comprise interconnects for carrying power and signals through the integrated circuit 200. In particular, the interconnects can couple various transistors in active layer 202 together such that they operate on a given signal in combination. The interconnects can comprise multiple wiring layers and vias that interconnect wiring layers. The wiring layers could be separated by layers of insulating material to prevent short circuits between the signals in integrated circuit 200. As such, and as shown in the cross section of integrated circuit 200 in FIG. 2, the different wiring layers can contain overlapping wiring to allow signals to be routed efficiently through the integrated circuit. In situations where the wiring comprises metal, these layers can be referred to as the metallization of the integrated circuit. The metal can be a common metal used in CMOS processing such as copper or aluminum. The insulating material can be a thermally insulative material with high thermal resistance to prevent heat spreading from channel 301 to the rest of the system. The insulator can be a low-k dielectric.

RF PCM switches 204 can be formed above active layer 202. At least one metallization layer can be located between a channel of the PCM switch 204 and the semiconductor substrate 201. As used herein, the terms "above," "top," synonyms thereof, and opposites thereof, are used with respect to a frame of reference that treats the side of substrate 201 that faces away from active layer 202 as the bottom of integrated circuit 200, and the side of active layer 202 that faces away from substrate 201 as the top of integrated circuit 200. Channels for RF PCM switches 204 can be formed on an insulator layer that covers at least a portion of the wiring layer. As illustrated, a thin dielectric layer 205 has been blanket deposited on the top of the wiring layer of active layer 202. However, the insulator layer may only cover a portion of the wiring layer and can be deposited using a mask or deposited and then etched into a pattern. In addition, the wiring layer may not have any wires running directly under the insulator.

RF PCM switch 204 can be described in more detail with reference to cross section 300 and circuit schematic 310 in FIG. 3. RF PCM switch 204 comprises a PCM channel 301, a heating element 302, and a thermally conductive dielectric located between the PCM channel and the heating element. In FIG. 3, the thermally conductive dielectric comprises a portion of the thin insulator layer 205 that was formed over the wiring layer of the integrated circuit. The insulator layer 205 can be formed over the wiring layer of the integrated circuit with additional layers between itself and the top of the wiring layer such that it does not necessarily need to be formed on the interconnect layer. The insulator layer can be a thermally conductive material with low thermal resistance. RF PCM switch 204 further comprises first via 304 and second via 305. The first and second vias provide first and second contacts to PCM channel 301. The entire RF PCM switch 204 can be covered with an insulator 306. The insulator 306 can be a dielectric and can be an interlayer dielectric (ILD). In particular, the insulator can be a thermally insulative material with high thermal resistance to prevent heat spreading from channel 301 to the rest of the system. The insulator can be a low-k dielectric. In operation, PCM channel 301 will provide either an electrically conductive or nonconductive path between first contact and second contact based on the phase of the material that forms PCM channel 301 as influenced by heat applied to PCM channel 301 via heating element 302.

PCM channel 301 can comprise various materials that can exhibit electrically conductive or nonconductive characteristics based on the phase of the material. These phases can be referred to interchangeably as the set and reset states of the PCM switch. The phase of the material can be set by an intensity and duration of heat applied to the channel. PCM channel 301 may require the continuous application of heat to maintain itself in a certain phase. In addition, PCM channel 301 may alter its phase in response to a pulse of applied heat, and maintain that state once the pulse of heat is removed. Furthermore, PCM channel 301 may alter its phase in both directions (i.e., set to reset and reset to set) in response to pulses of heat with different characteristics.

In specific approaches, the PCM channel can comprise a chalcogenide alloy. In these approaches, the PCM channel is placed in different phases by the application of a short but intense burst of heat to transition the channel to an amorphous state while the application of a longer and less intense pulse of heat holds the channel at its crystallization temperature for a duration of time that is sufficient to switch the channel to a crystalline state. The crystalline state is electrically conductive while the amorphous state is electrically insulative. Potential chalcogenide alloys for use as the PCM channel include germanium-antimony-tellurium (GST), germanium-tellurium, and germanium-antimony. These materials have very high resistance in amorphous condition and a much lower resistance when in the NaCl-type crystalline condition that they exhibit when in a crystalline state.

The PCM channel can be altered between phases using direct or indirect heating using a heating element. Direct heating involves the application of power to a heating element that is in direct contact with the PCM channel. For example, a set of transistors directly connected to the PCM channel could be forced to sink large currents such that power was consumed in the transistors and heat was generated to affect the PCM channel. As another example, a resistor, such as a polysilicon resistor, in direct contact with the PCM channel could be used in a similar fashion. As another example, a basic wire could be used as a heating element. The heating element can comprise a metal such as copper or aluminum. Indirect heating involves the application of power to a material that is separated from the PCM channel by an electrical insulator that is thermally conductive. The thermally conductive electrical insulator could be silicon dioxide or silicon nitride. All of the heating elements mentioned above for direct heating can also be used for indirect heating applications. However, based on the thermal conductivity and thickness of the electrical insulator, more power might be needed in the case of indirect heating.

The heating element can be tied to a voltage or current source that provides the power required to generate heat for the PCM channel. The current can be controlled by a transistor. Furthermore, since in certain approaches the power will need to be applied rapidly to allow the PCM switch to operate effectively in RF applications, the current could be supplied from a reactive element such as a capacitor or inductor that can provide a burst of power without overly taxing the power supply of the integrated circuit. The power supplied can be modified based on the ambient conditions in which the switch is operating. For example, in cold conditions, the required power could be dynamically adjusted upwards to compensate. The power supplied can also be trimmed for individual integrated circuits or specific wafers to compensate for process variations in the characteristics of the PCM switch. In specific approaches, both the set and reset pulses used to alter the state of the PCM switch can be trimmed independently to optimize performance. The power supplied can also be modified based on a current frequency the integrated circuit is operating on.

The heating element can take on various geometric configurations relative to the PCM channel. As shown in cross section 300, the heating element 302 can be a strip of material lying below PCM channel 301. Also, a second heating element 303 can lie above and overlap a portion of PCM channel 301 such that the PCM channel is located between, and is sandwiched by, the two heating elements. As a result, power applied to both heating elements will heat up the stack between the two elements in both directions. In other approaches, a PCM switch may contain only one of the two heating elements. In addition, various different numbers of heating elements may be utilized such as multiple strips of material on both the top and bottom of the PCM channel. The intensity of heat generated in each portion of the heating element may be equivalent in that the same current or voltage signal can be sent to each. However, different intensities of signals can be sent to different portions of the heating element to affect the phase change process. This approach is particularly useful for applying different heat profiles for the reset and set phase changes of the PCM.

The lateral expanse of the heating element can be equivalent to the lateral expanse of the PCM channel except for space left over for contacts to the PCM channel. The heating element could contact the PCM channel along its entire length or could only be in contact with the PCM channel in a narrower region. As drawn, the PCM channel 301 is centered with heating elements 302 and 303 and the heating elements sandwich a first portion of the PCM channel 301. The PCM channel is coupled to vias 304 and 305 at two locations that lie outside the lateral expanse of the first portion of the PCM channel. However, the lateral expanse of the heating element can also be equivalent to the lateral expanse of the PCM channel. In either of the latter two cases, the lateral expanse of the heating element may exceed that of the PCM channel and electrically conductive leads may extend out from the PCM channel to provide contacts to the PCM channel.

The geometric configuration of the heating elements is not limited to strips of material. The heating element can wrap completely around the PCM channel and exhibit a partially hollow cylindrical or cubed shape. For example, the PCM channel could be in the shape of an annulus and the thermally conductive insulator and heating elements could exhibit the shape of three hollow cylinders having hollow portions with increasing diameters wrapped around the PCM channel and a central cylindrical heating element at the core of the overall cylinder. As an additional example, the PCM channel could be in the shape of a cylinder and the thermally conductive insulator and heating elements could exhibit the shape of two hollow cylinders having hollow portions within increasing diameters wrapped around the PCM channel. In addition, the PCM channel can present a jagged or patterned surface to the direct heating element, or the thermally conductive insulator in the indirect heating case, to maximize the surface area of the PCM channel that is exposed to the applied heat.

With reference again to FIG. 3, one heating element could comprise a layer of metal or other conductive material in the wiring layer of an integrated circuit. Heating element 302 could be a top layer of metal in the wiring layer of an integrated circuit. The top layer of metal could be the top wiring layer in a standard CMOS process flow. However, the top layer of metal could also be the bottom plate metal for a metal-insulator-metal (MIM) capacitor for a standard CMOS process flow with integrated MIMs capacitors. In these approaches, the insulator layer 205 could be deposited in two steps, one in which the regular insulator for the MIM capacitor is deposited, and one after that layer of material has been etched and the PCM channel has been formed. In turn, insulator layer 205 could be a top layer of insulation or passivation that is used as the cap layer for the wiring in a standard CMOS processing flow. As another example, the insulator layer could be the dielectric of a MIM processing flow. However, insulator 205 could also be a separate dielectric layer introduced into a process flow specifically for purposes of creating PCM switch 204.

As drawn in cross section 300, the insulator layer on which switch 204 is formed, and the thermally conductive dielectric that isolates the heating element from the PCM channel 301 could be a single layer of material 205. However, the material could be deposited in multiple steps such as before and after the PCM channel 301 is formed. In addition, different insulators could be used for the insulator on which the PCM switch is formed and the insulator located between the PCM channel and the heating element. Further still, in situations where the heating element was below the PCM channel and a second heating element was above the PCM channel, a different insulator could be used for the insulator between the second heating element and the PCM channel. However, the same insulator could be used for all three of the aforementioned insulators.

Additional portions of the PCM switch can exhibit various characteristics. For example, the first via 304 and the second via 305 could be made thick enough to help transfer heat out of the PCM channel 301 when it was time to cool the device. In a specific approach, the vias could each be at least three times as wide as the PCM channel. The vias could by regular conductors used in semiconductor manufacturing such as copper or aluminum. The dielectric 306 can be any low-k dielectric used in standard CMOS processing such as TEOS or silicon dioxide.

Schematic 310 represents a PCM switch that utilizes indirect heating. As illustrated, the heating element representation 311 is not electrically coupled to PCM channel 301. However, the power applied to heating element representation 311 will affect the PCM channel 301 such that it is in a conductive or non-conducive state. In this sense, the indirectly heated PCM switch is analogous to a three terminal field affect transistor in that the electrical signal on heating element representation 311 is electrically isolated from the electrical signal that passes from the first via 304 to the second via 305. However, the indirectly heated PCM switch for cross section 300 is drawn as a four terminal device because the signal applied to the heating element in the illustrated case is a continuous current that flows through the heating element. Notably, schematic 310 only represents cross section 300 in situations where the same signal is applied to both heating elements 303 and 302. In situations where a different signal was being applied to heating elements, an additional set of terminals would need to be added to schematic 310 along with an additional heating element representation.

Referring back to FIG. 2, electrical contact can be made to both the PCM switches 204 and FETs 203 through the use of contacts 206 on the surface of dielectric layer 207. As mentioned previously, dielectric layer 207 can be a low-k dielectric layer. Contacts 206 can provide external connections to the integrated circuit through the use of redistribution layers, bond wires, solder balls, copper posts, or any combination thereof. Dielectric layer 207 can be a top-level dielectric layer for the semiconductor process in which the integrated circuit is fabricated. As such, the layer may be amenable to blanket deposition, and the vias from contacts 206 into the internal circuitry of the integrated circuit can be etched through the dielectric layer 207 after it is deposited. With reference to both FIGS. 2 and 3, the dielectric layer can be the same as insulator 306 in FIG. 3. The contacts to the PCM switches and the FETs can be surrounded by the dielectric. Vias providing an electrical connection from the contacts to the FETs can extend all the way down through the wiring layer to the active layer or they can stop in the wiring layer. As illustrated, the vias can be physically connected to a wire in the wiring layer.

The integration of FETs 203 and PCM switches 204 allows the control circuitry for the PCM switches to be implemented using FETs in the same integrated circuit as the PCM switches. In addition, in approaches where a capacitor, or other reactive element, supplies a pulse of energy to the heating element in response to a signal from the control circuit. The reactive element can also be integrated in the integrated circuit. For example, the capacitor could be a metal-insulator-metal capacitor formed above active layer 202. Control signals for the PCM switches can be routed up from the active layer to the PCM switches. In the particular implementation shown in FIG. 2, the lower heating element of the PCM switches 204 is a metal layer in active layer 202. Therefore, routing the required signal to the lower heating element is as simple as drawing a routing path in the wiring of the integrated circuit. Contact from the upper heating element of the PCM switches 204 is more easily explained with reference to a plan view of the integrated circuit.

Figure 4:
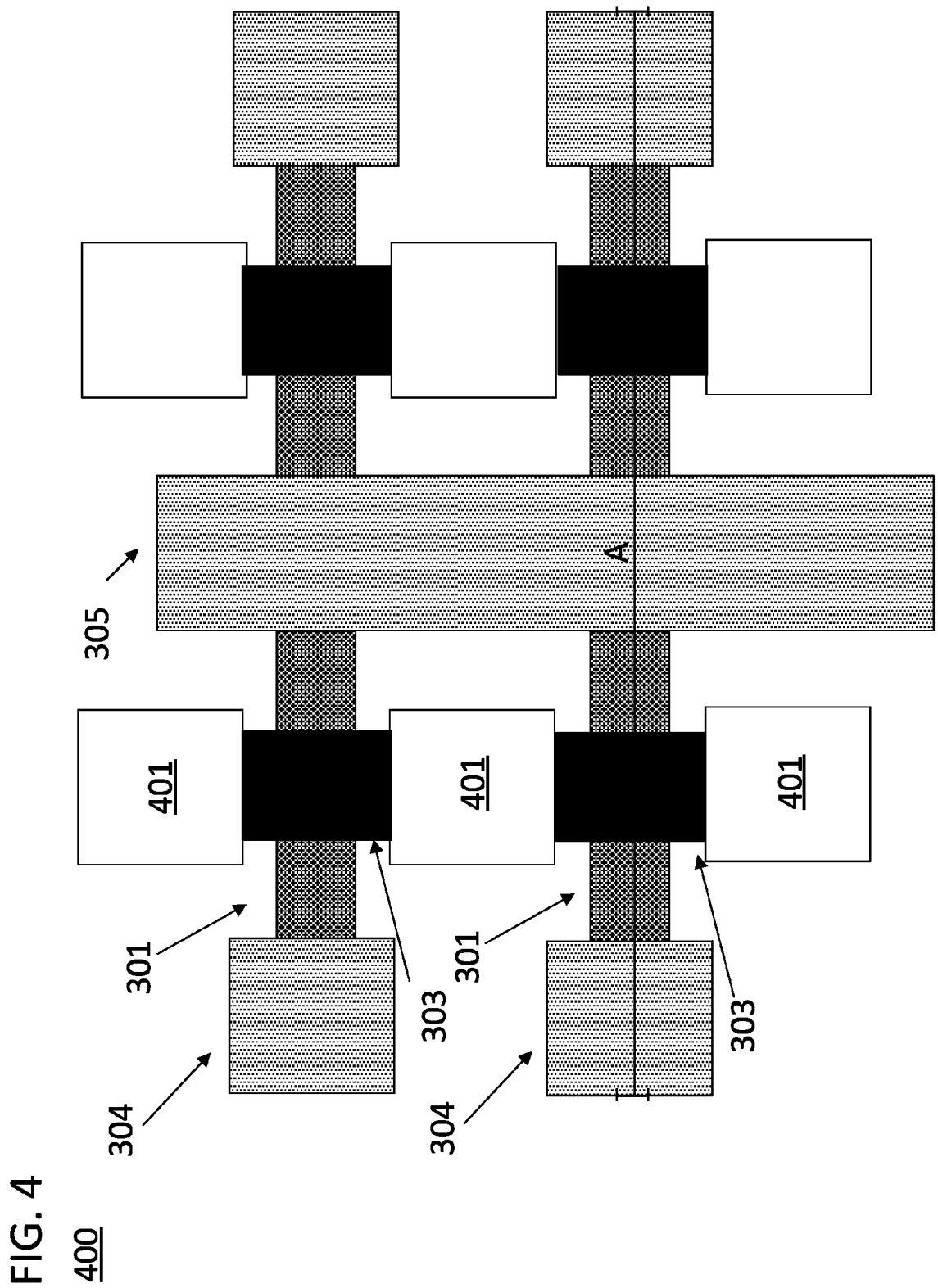
FIG. 4 illustrates a plan view of an integrated circuit having an integrated phase change material switch that is in accordance with embodiments of the present invention.

FIG. 4 displays plan view 400 of four PCM switches in an integrated circuit that can exhibit the characteristics described above. Reference line A in plan view 400 corresponds to reference line A in cross section 200. The specific configuration shown provides a single pole four throw (SP4T) switch. In this implementation, via 305 is the main signal bus of the switch. The signal bus can be connected to an antenna contact. Four PCM channels 301 extend laterally away from the main signal bus and, when in a conductive state, provide an electrically conductive path to vias 304. In this implementation, the four vias 304 are the throws of the SP4T switch. The plan view also shows contacts 401 that are electrically coupled to heating elements 303 that overlap portions of the PCM channels 301. Contacts 401 are illustrated using a different fill pattern than vias 304 because contacts 401 do not necessarily need to rise up through the top level dielectric layer. Instead contacts 401 can drop directly down through insulator layer 205 to provide an electrical connection to control FETs in the active layer of the integrated circuit. In accordance with the illustrated example, the bottom heating element 302 could be connected to the same via that extends from contacts 401 down to the control circuitry.

Figure 5:
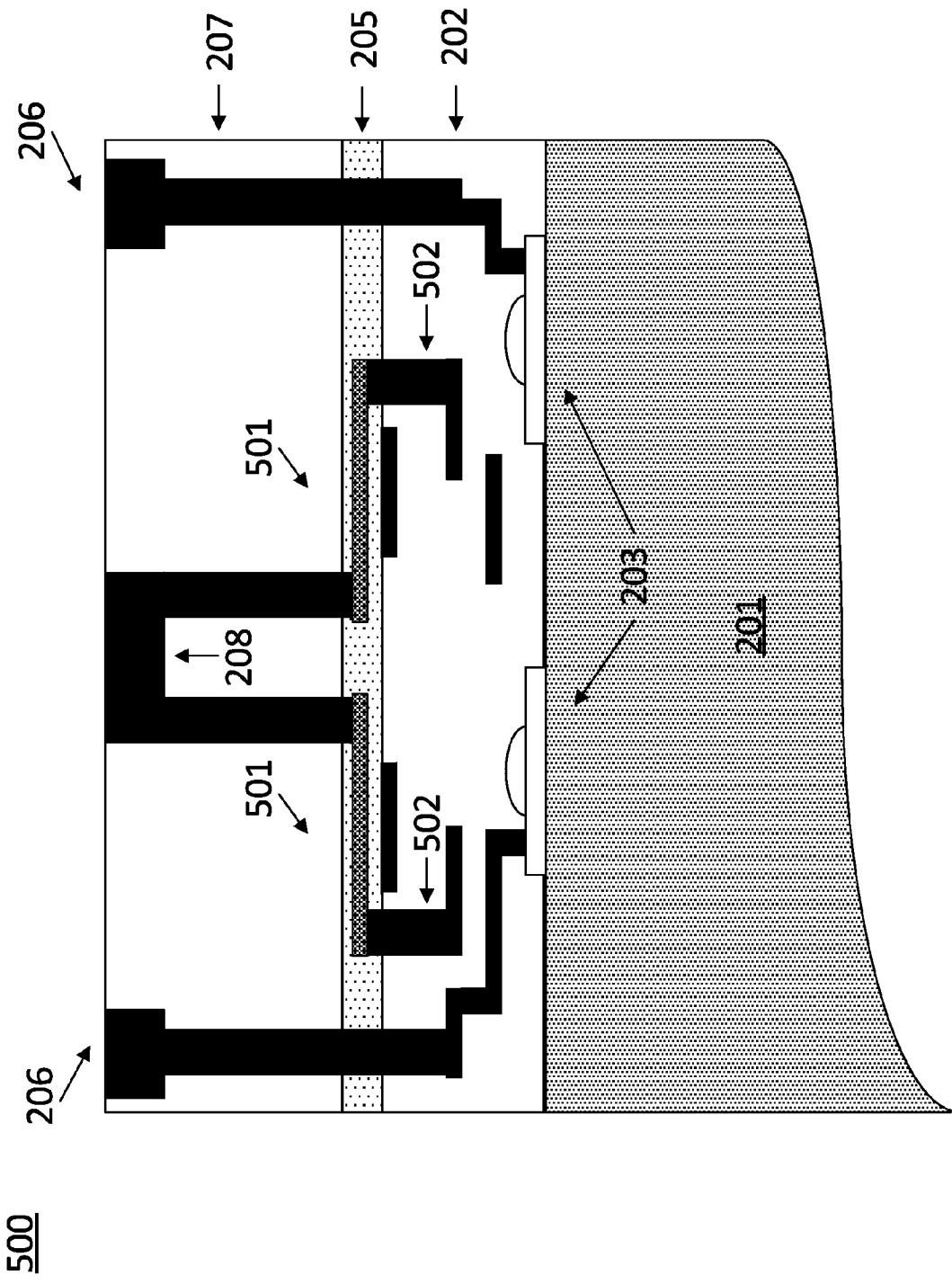
FIG. 5 illustrates a cross section of an integrated circuit having an integrated phase change material switch that is in accordance with embodiments of the present invention.

FIG. 5 illustrates cross section 500 which exhibits a particular combination of the approaches discussed above. Cross section 500 is similar to cross section 200 However, PCM switches 501 in cross section 500 only exhibit a single heating element. As illustrated, the top heating element is not included in PCM switches 501 such that the PCM channel is only heated from the bottom side. As mentioned previously, the bottom side heating element can be metallization in the interconnect layer such as a top level wiring layer or the bottom plate of an integrated MIM capacitor. Cross section 500 also differs in the PCM channel vias 502 are connected to contacts on the bottom side of the PCM channels. As described above, these vias can extend down directly through insulator layer 205 into active layer 202.

Although FIG. 4 illustrates the use of PCM switches in a SP4T configuration, the approaches described herein can be applied to other switch configurations. In particular, the two PCM switches in FIG. 2 could be a complete single pole double throw (SP2T) switch. As such, the two PCM switches could be coupled to a main signal line contact 208. In a specific application, the signal line contact will be an antenna contact. The PCM switches could then be used to provide either a transmit path to or a receive path from the antenna. In the alternative, the PCM switches could be used in a series-shunt configuration to provide alternating paths from the antenna to ground and to the downstream portions of the radio to which they are attached. The integrated circuit can comprise any number of PCM switches required to implement a given application. The collected number of PCM switches can all comprise copies of interconnected SP2T switches as shown in FIG. 2. However, the switches do not all need to have a contact exposed to provide an external contact for the integrated circuit. Instead, signals could be routed within the integrated circuit from one PCM switch to another.

Figure 6:
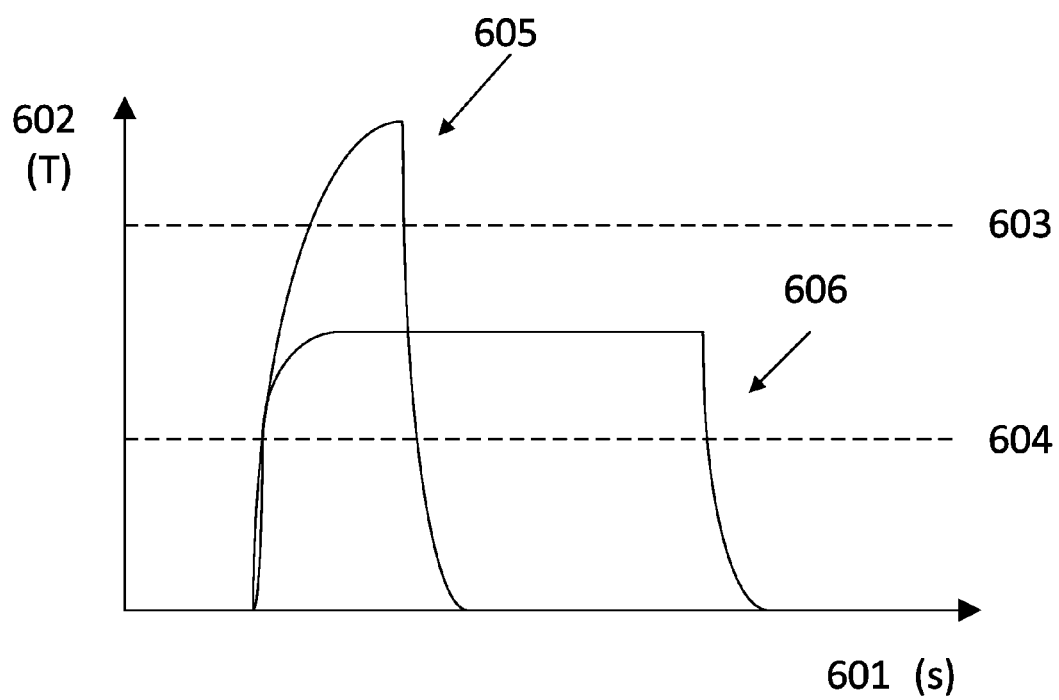
FIG. 6 illustrates a graph with time as the x-axis and temperature as the y-axis which charts pulses of energy delivered to a phase change material channel that is in accordance with embodiments of the present invention.

FIG. 6 displays a graph 600 with an x-axis 601 in units of time and a y-axis 602 in units of temperature. The graph can be used to describe one approach for providing pulses of heat to transfer the phase of the PCM channels. The illustrated approach does not apply to all PCM channels, but is instead directed to PCM channels that vary between amorphous and crystalline states. In addition, the description with respect to graph 600 describes the transition from the crystalline to the amorphous state as the reset transition and the transition in the other direction as the set transition. However, these terms can be used interchangeably as long as they are consistently applied in a given application to denote a one way change between conductive and nonconductive states. Lines 603 and 604 denote the melt temperature and crystallization temperature of the PCM channels respectively. As such, the intense but brief reset pulse 605 quickly brings the PCM channel to above the melting point of the PCM material such that the crystal structure of the PCM collapses and the PCM takes on an amorphous state. Pulse 605 drops quickly from the melt temperature 603 to below the crystallization temperature because it is between lines 603 and 604 that a crystallized structure will develop, but the material needs to stay in that region for a period of time before crystallization will occur. By transitioning through this region quickly, the crystallized structure does not redevelop after the crystal has melted. The longer and less intense set pulse 606 brings the PCM channel above the crystallization temperature 604, but below the melting temperature, and holds in there until full crystallization has had time to develop.

For PCM channels using chalcogenide alloys, the crystallization temperature is slightly above 100 C and full crystallization will occur in the order of tens of nanoseconds. However, improvements in PCM channels may lead to shorter crystallization times in the future, and crystallization times can be lengthened or shortened for specific applications via the careful selection of material for the PCM channel. In specific approaches, the reset pulse is delivered to the heating element, and the heating element is expected to diffuse heat into the PCM channel and then cool in under 5 nanoseconds. The diffusion of heat in the direct heating or indirect heading case described is fairly rapid such that a reset pulse could potentially be less than 10 nanoseconds in duration.

Figure 7:
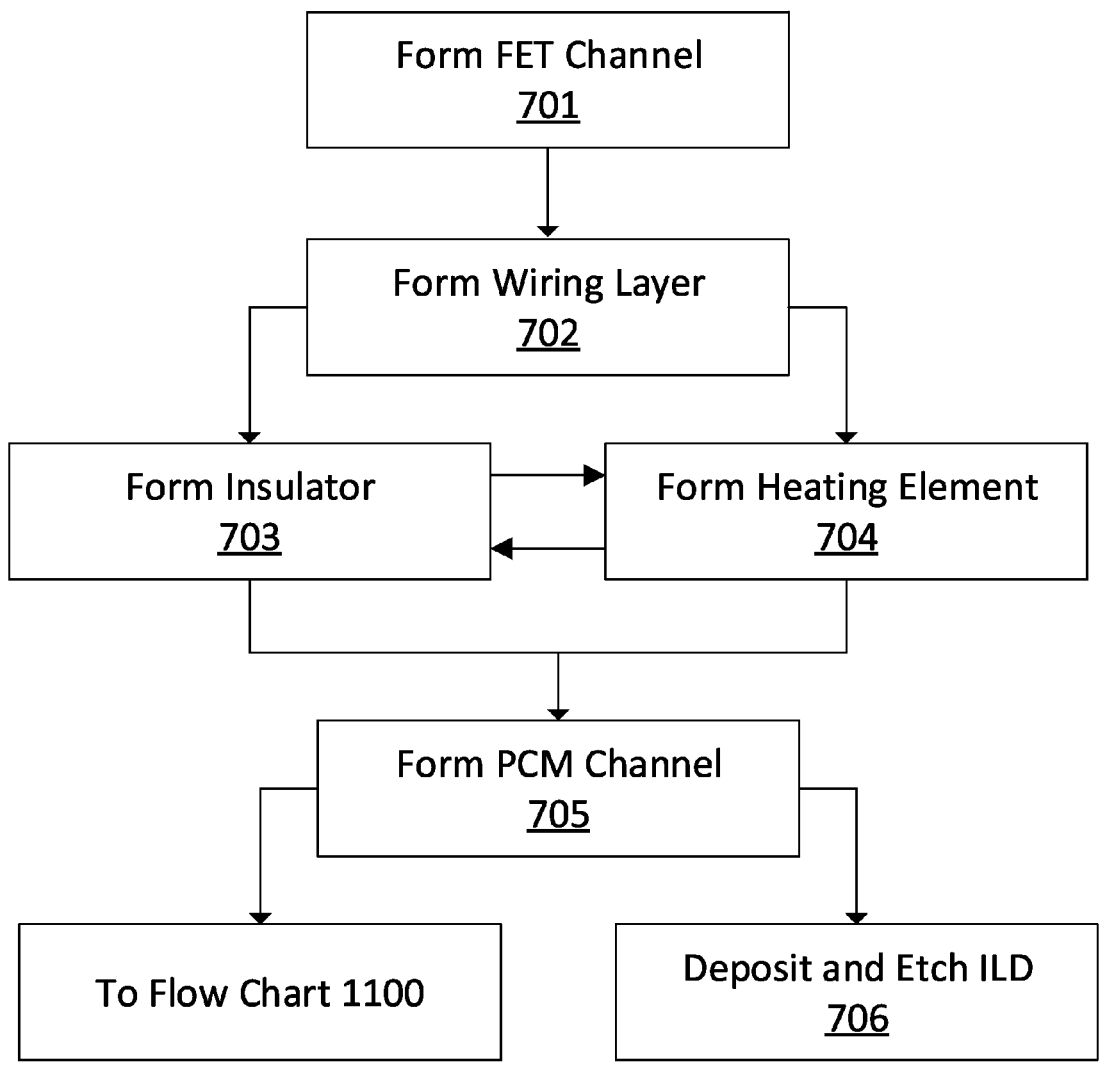
FIG. 7 illustrates a flow chart of processes for fabricating an integrated circuit having an integrated phase change material switch that is in accordance with embodiments of the present invention.

Process for fabricating an integrated circuit with a PCM switch can be described with reference to flow chart 700 in FIG. 7. In step 701, a plurality of FET channels are formed in a layer of semiconductor material. In step 702, an interconnect layer comprising a plurality of interconnects that are coupled to the FETs are formed. The interconnect layer can comprise a network of conductive wires separated by dielectric materials. In step 703, an insulator layer is formed over at least a portion of the wiring layer.

Figure 8:
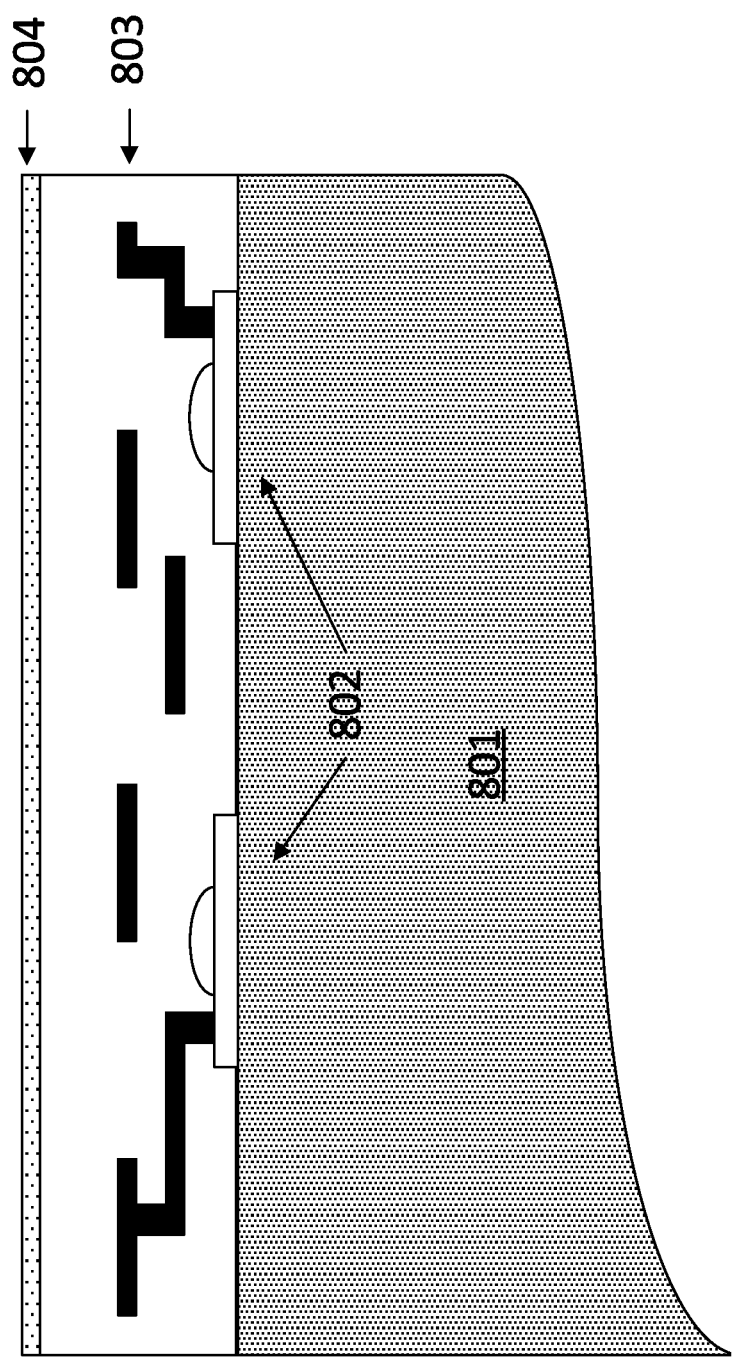
FIG. 8 illustrates a cross section of an integrated circuit being fabricated in accordance with the processes of the flow chart in FIG. 7 that is in accordance with embodiments of the present invention.

Cross section 800 in FIG. 8 illustrates a semiconductor wafer after steps 700-703 have been executed. The cross section includes substrate 801 and FET channels 802 formed in a layer of semiconductor material. The channels can be formed through the introduction of dopants into the semiconductor layer. The semiconductor layer can be part of the substrate, it can be epitaxially grown, or it can be layer transferred material. The cross section also illustrates wiring layer 803 and insulator layer 804. Wiring layer 803, FET channels 802, and insulator layer 804 can all be constructed in accordance with a standard CMOS manufacturing process. Insulator layer 804 can be a standard passivation layer deposited on the surface of wiring layer 803. Insulator layer 804 can also be the dielectric of an integrated MIM capacitor. Finally, insulator layer 804 can also be a thin dielectric formed on the surface of the wiring layer that would not usually be in a standard CMOS manufacturing process.

Figure 9:
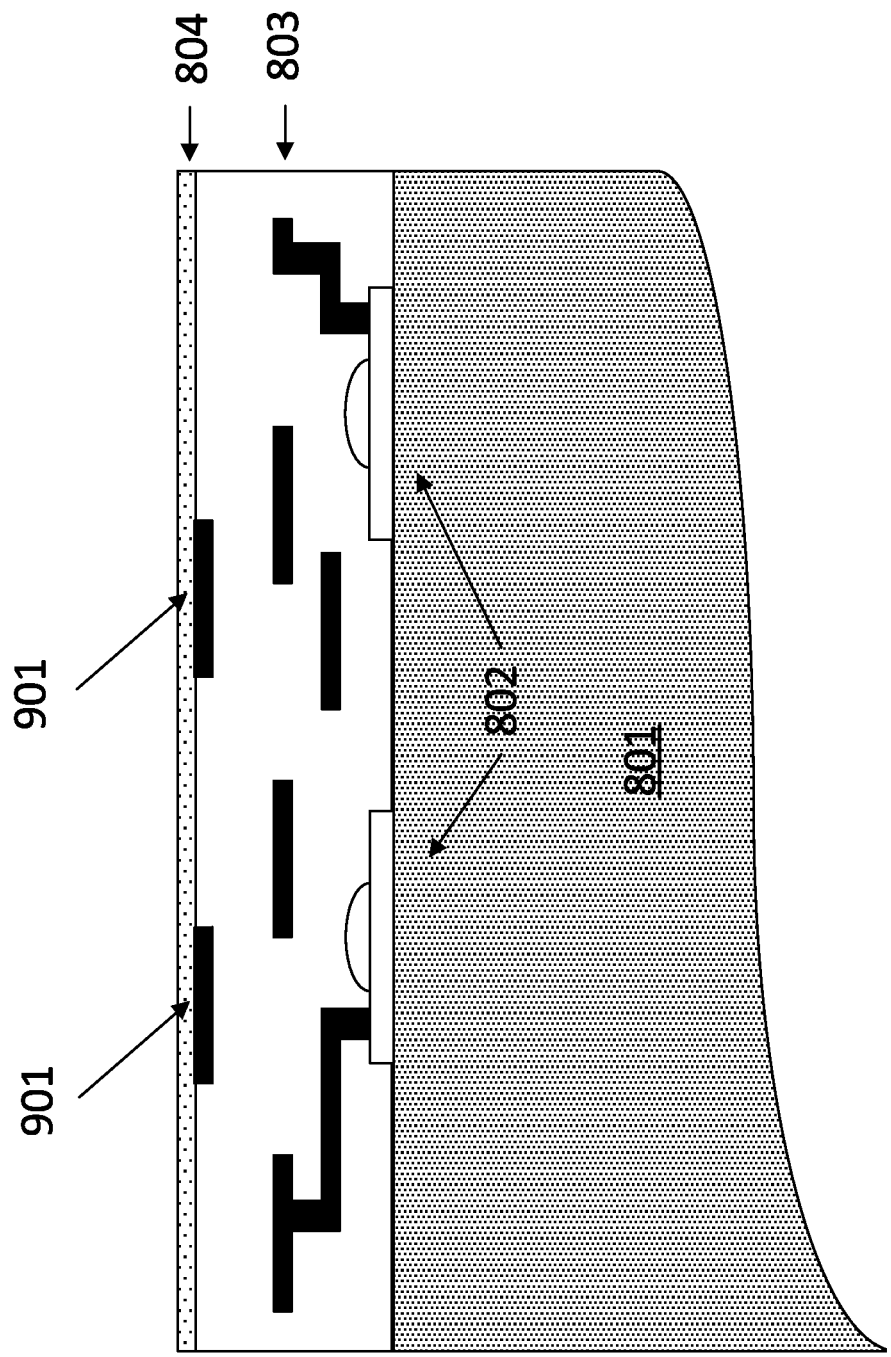
FIG. 9 illustrates another cross section of an integrated circuit being fabricated in accordance with the processes of the flow chart in FIG. 7 that is in accordance with embodiments of the present invention.

Flow chart 700 branches after step 702 because the step of forming a heating element 704 can be conducted before or after the step of forming the insulator layer 703. As illustrated by cross section 900 in FIG. 9, the heating elements 901 can be formed before depositing insulator 804. In the illustrated example, heating elements 901 comprise wiring in the wiring layer 803. The heating element can therefore be formed by etching a top layer of metal in the wiring layer to form the heating element. However, this same sequence of steps could involve the formation of a different kind of heating element above the wiring layer prior to the formation of insulator layer 804. For example, a polysilicon resistor could be formed above the wiring layer prior to the formation of insulator layer 804. In these approaches, the insulator layer will serve as a thermally conductive dielectric for the PCM switch and will be located between the heating element and the PCM channel. The insulator can be a thin dielectric material that is blanked deposited over the heating element and the surface of the wafer. Although not illustrated, the heating element could also be formed on top of the insulator layer 804 in which case the entire PCM switch would be formed above the insulator layer.

Processes for executing steps 701-704 described above can be executed without using any masks that would otherwise be used in a standard CMOS manufacturing process. In particular, if heating element 901 is otherwise used as the top layer of wiring in wiring layer 803 or as the bottom plate of an integrated MIM capacitor, patterning the heating elements does not require a mask that would not otherwise be used in the flow. In addition, if insulator layer 804 is blanked deposited or formed through any other global wafer processing step, then there is no need for a mask to pattern the insulator either. Likewise, if insulator layer 804 is formed in the insulator layer of an integrated MIM capacitor in the process flow, then a patterned insulator can be formed using a mask that would otherwise be utilized for other purposes. Therefore, in these cases a patterned heating element and insulator for a PCM switch can be provided without any additional fixed cost to the production process. For example, MIM capacitors could be used for ESD circuits or for the optional capacitor mentioned above that supplies a pulse to the heating elements in response to a signal from the control circuit. Since a mask was already tasked for the production of the bottom electrode of these capacitors, there would be no additional cost in patterning the thin dielectric for a PCM switch.

Figure 10:
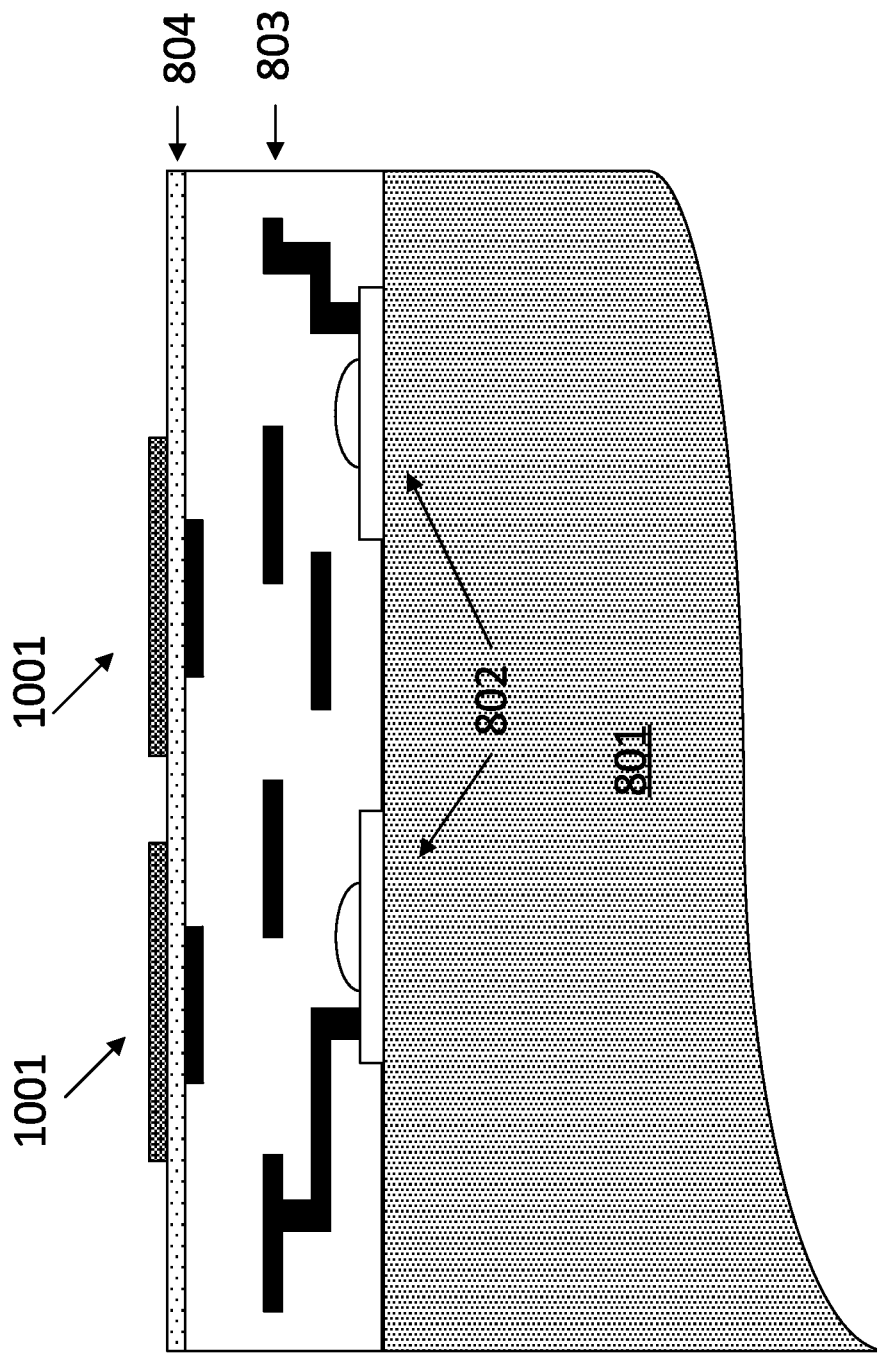
FIG. 10 illustrates another cross section of an integrated circuit being fabricated in accordance with the processes of the flow chart in FIG. 7 that is in accordance with embodiments of the present invention.

Flow chart 700 continues with step 705 in which a channel of an RF PCM switch is formed using a first mask. If specific approaches described above were utilized for step 701-704, then the mask used in step 705 could be the first custom mask necessary for the process required to generate an RF PCM switch as compared to a standard CMOS process. Cross section 1000 in FIG. 10 illustrates RF PCM channels 1001 formed above insulator layer 804. The channels can be formed through the deposition of a phase change material in combination with the first mask or through a blanked deposition of the material and an etching step utilizing the first mask. After the channels are formed, the process can proceed to step 706 in which an ILD layer is deposited over the PCM channels. Alternatively, a second dielectric and a second heating element can be formed over the PCM channels before the ILD is deposited over the PCM channels. The ILD can then be etched to form vias to the PCM switches, or the FETs, or both. In particular, the dielectric can be etched to form a via coupled to a shared contact of two RF PCM switches. This region of etched material can then be filled with conductive material and finished with an external integrated circuit contact. For example, the external contact can serve as an antenna contact for the integrated circuit. Flow chart 700 can alternatively proceed to method 1100 in FIG. 11.

Figure 11:
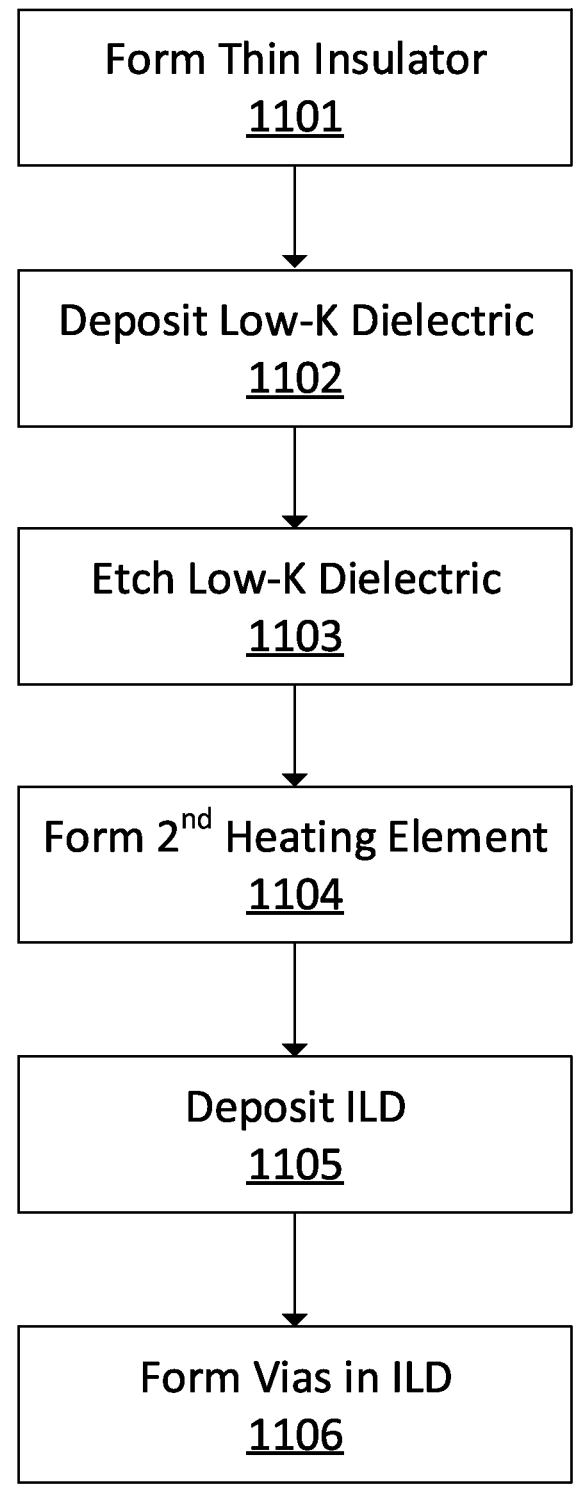
FIG. 11 illustrates a flow chart of a processes for fabricating an integrated circuit having an integrated phase change material and via contacts through a dielectric that are in accordance with embodiments of the present invention.
Figure 12:
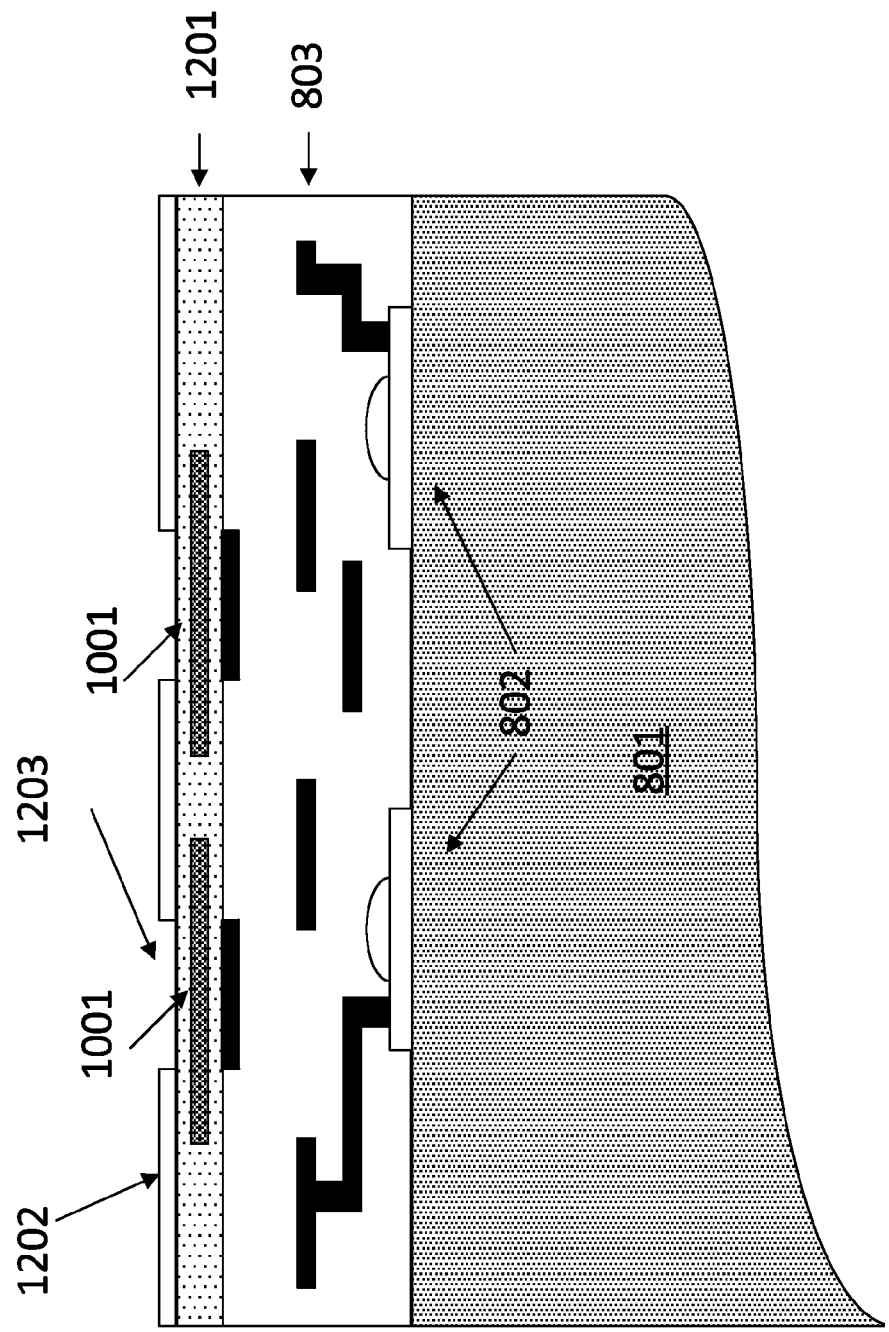
FIG. 12 illustrates a cross section of an integrated circuit being fabricated in accordance with the processes of the flow charts in FIGS. 7 and 11 that is in accordance with embodiments of the present invention.
Figure 13:
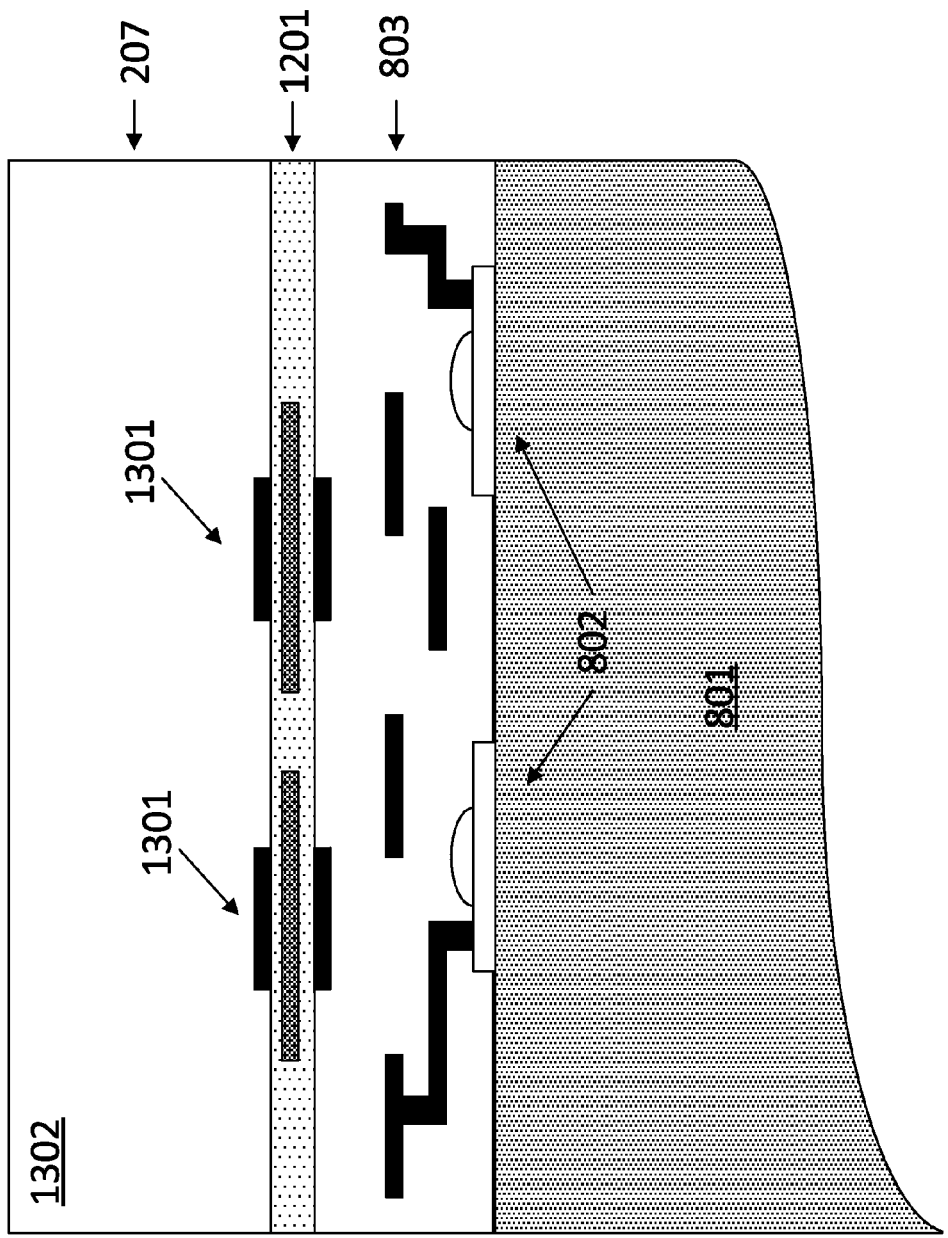
FIG. 13 illustrates another cross section of an integrated circuit being fabricated in accordance with the processes of the flow charts in FIGS. and 11 that is in accordance with embodiments of the present invention.

FIG. 11 illustrates a flow chart 1100 that is specific to PCM switches that are indirectly heated. The process can be described with reference to cross sections 1200 and 1300 in FIGS. 12 and 13. In step 1101, a thin insulator is formed over the PCM channel. As shown in FIG. 12, the thin insulator can be the same material as was formed in step 703 such that a layer of insulating material 1201 completely surrounds the PCM channels. In step 1102, a low-k dielectric is deposited over the thin insulator to form a low-k dielectric layer 1202. In step 1103, the low-k dielectric is etched with a second mask using the thin insulator 1201 as an etch stop. If certain approaches for prior steps were used as described above, this second mask will be the second mask not otherwise required in a standard CMOS process because each of steps 1101 and 1102 only require blanket depositions or global wafer treatments. The result of this etching step will be the creation of an excavated low-k dielectric region 1203 that overlaps a portion of the PCM channels. As described above, the excavated region may be laterally coextensive with the lateral expanse of the PCM channel or it may only expose a portion of the PCM channel.

In step 1104 a second heating element 1301 is formed in the excavated low-k dielectric region 1203. In specific approaches, this step can be executed by a blanket deposition of PCM followed by a blanket chemical mechanical polish or other processing step that is selective to the low-k dielectric and will remove the PCM except for where it is below the surface of the low-k dielectric. This kind of processing step is beneficial in that it does not require an additional mask step. Alternatively, the second heating element 1301 can be formed through the use of a deposition and patterned etch or through a patterned deposition using a mask.

The integrated PCM switch can then be finalized in steps 1105 and 1106. In step 1105 an ILD 1302 is deposited over the second heating element. The ILD does not require a mask because it can be formed via a global wafer processing step. In step 1106 vias are formed in the ILD using a third mask. The vias provide an electrically conductive contact to the PCM channels. These contacts can be shared contacts such as shared contact 208 in FIG. 2 or they can independently contact a single PCM switch. The vias are connected to external contacts for the PCM switches. However, the external contacts can also be routed over an external surface of the integrated circuit using an RDL and be connected to other vias that provide an electrically conductive connection back into the integrated circuit. Additional processing steps will be required to form such RDL or other finalized external contacts in accordance with the discussion relative to contacts 208 above.

Step 1106 can also comprise the formation of another via using a fourth mask. The vias formed using the fourth mask can guide a second etch step that can extend down past the PCM switches. In specific approaches, these contacts will extend down all the way to the wiring layer and can provide an electrically conductive contact to wires in the wiring layer. This processing step can produce contacts similar to contact 206 in FIG. 2 such that external contacts can be provided to the FETs in active layer 202. As with contacts 208, these contacts can undergo additional processing steps to form finalized external contacts in accordance with the discussion relative to contacts 206 above.

Although some embodiments in the above disclosure were directed to indirectly heated PCM switches, this disclosure is not limited to indirectly heated PCM switches and extends to the integration of any kind of heating scheme for a PCM including direct and self-heating. As used herein, the term forming is meant to include forming a structure by any means including through deposition, sputtering, growth via a chemical treatment such as oxidation, etching, grinding, and any other standard semiconductor processing step used to form structures in an integrated circuit. Similar parts of the integrated circuits that are described with reference to the flow charts in this disclosure can exhibit the same variations in material content, geometrical configuration, and circuit implementation as described with reference to the devices in FIGS. 2-4. Furthermore, although silicon and FETs were used as the exemplary semiconductor material and transistor technologies in many of the examples provided above, any semiconductor material or transistor technology could be used in their place. Examples of such semiconductor materials include compound semiconductors such as gallium arsenide, aluminum nitride, and indium phosphide and including. Examples of transistor technologies include CMOS FETs, BiCMOS BJTs and FETs, BJTs, 3D transistors, nanojunctions, and any other switch technology.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:
1. An integrated circuit comprising:
   an active layer comprising a plurality of field effect transistor channels for a plurality of field effect transistors;
   an interconnect layer comprising a plurality of conductive interconnects, wherein the plurality of conductive interconnects couple the plurality of field effect transistors;

an insulator layer covering at least a portion of the interconnect layer; and
a channel of a radio-frequency phase change material switch, wherein the channel of the radio-frequency phase change material switch is formed on the insulator layer.

2. The integrated circuit of claim 1, wherein the radio-frequency phase change material switch comprises:
a phase change material channel;
a heating element; and
a thermally conductive dielectric located between the phase change material channel and the heating element.

3. The integrated circuit of claim 2, wherein:
the phase change material channel comprises a chalcogenide alloy;
the heating element comprises a metal selected from a group consisting of copper and aluminum; and
the thermally conductive dielectric comprises a dielectric selected from a second group consisting of silicon dioxide and silicon nitride.

4. The integrated circuit of claim 2, further comprising:
a second channel of a second radio-frequency phase change material switch, wherein the second channel of the second radio-frequency phase change material switch is formed over the insulator layer;
a control circuit that controls when the heating element heats the phase change material channel; and
a single pole double throw switch comprising the first and second radiofrequency phase change material switches;
wherein the first and second radio-frequency phase change material switches are both coupled to an antenna contact.

5. The integrated circuit of claim 2, wherein:
the insulator layer and the thermally conductive dielectric comprise a single layer of deposited material; and
the heating element is a top layer of metal in the interconnect layer.

6. The integrated circuit of claim 5, wherein:
the heating element is a strip of the top layer of metal in the interconnect layer;
the top layer of metal in the interconnect layer is a metal-insulator-metal capacitor metal; and
the insulator layer is a metal-insulator-metal capacitor dielectric.

7. The integrated circuit of claim 2, wherein the radio-frequency phase change material switch further comprises:
a second heating element that overlaps a portion of the phase change material channel; and
a second thermally conductive dielectric located between the phase change material and the second heating element;
wherein the phase change material channel is located between the first and second thermally conductive dielectrics and is centered with the first and second heating elements; and
wherein the phase change material channel is coupled to a via that contacts the phase change material channel at a location that lies outside of the first portion of the phase change material channel.

8. The integrated circuit of claim 7, further comprising:
a top-level dielectric layer surrounding the via; and
a second via with a top portion that is surrounded by the top-level dielectric layer;
wherein a bottom portion of the second via is physically connected to a wire in the interconnect layer; and
wherein the plurality of field effect transistors are complementary metaloxide-semiconductor field effect transistors.

9. The integrated circuit of claim 8, further comprising:
a second channel of a second radio-frequency phase change material switch, wherein the second channel of the second radio-frequency phase change material switch is formed over the insulator layer;
a control circuit that controls when the heating element heats the phase change material channel;
a single pole double throw switch comprising a first throw, a second throw, and the first and second radio-frequency phase change material switches; and
a signal bus configured to accept an external electrical connection;
wherein the first and second radio-frequency phase change material switches are both coupled to the signal bus;
wherein the first radio-frequency phase change material switch is coupled to the first throw;
wherein the second radio-frequency phase change material switch is coupled to the second throw; and
wherein the control circuit comprises the plurality of field effect transistors.

10. The integrated circuit of claim 9, further comprising:
a capacitor that supplies a set pulse to the heating element in response to a signal from the control circuit;
wherein the set pulse is delivered to the heating element in under 10 nanoseconds; and
wherein the first throw and the signal bus are at least three times as wide as the phase change material channel.

11. A monolithic integrated circuit comprising:
a semiconductor substrate that has been doped to form a plurality of active regions for a plurality of field effect transistors;
a radio-frequency phase change material switch having a phase change material channel, a first contact, and a second contact; and
an interconnect layer located between the phase change material channel and the semiconductor substrate, wherein the radiofrequency phase change material switch further comprises:
a heating element; and
a thermally conductive dielectric located between the phase change material channel and the heating element.

12. The monolithic integrated circuit of claim 11, wherein:
the phase change material channel comprises a chalcogenide alloy;
the heating element comprises a metal selected from a group consisting of copper and aluminum; and
the thermally conductive dielectric comprises a dielectric selected from a second group consisting of silicon dioxide and silicon nitride.

13. The monolithic integrated circuit of claim 11, further comprising:
a second channel of a second radio-frequency phase change material switch, wherein the second channel of the second radio-frequency phase change material switch is formed over the insulator layer;
a control circuit that controls when the heating element heats the phase change material channel; and
a single pole double throw switch comprising the first and second radiofrequency phase change material switches;
wherein the first and second radio-frequency phase change material switches are both coupled to an antenna contact.

14. The monolithic integrated circuit of claim 11, wherein:
the insulator layer and the thermally conductive dielectric comprise a single layer of deposited material; and
the heating element is a top layer of metal in the interconnect layer.

15. The monolithic integrated circuit of claim 14, wherein:
the heating element is a strip of the top layer of metal in the interconnect layer;
the top layer of metal in the interconnect layer is a metal-insulator-metal capacitor metal; and
the insulator layer is a metal-insulator-metal capacitor dielectric.

16. The monolithic integrated circuit of claim 11, wherein the radiofrequency phase change material switch further comprises:
a second heating element that overlaps a portion of the phase change material channel; and
a second thermally conductive dielectric located between the phase change material and the second heating element;
wherein the phase change material channel is located between the first and second thermally conductive dielectrics and is centered with the first and second heating elements; and
wherein the phase change material channel is coupled to a first via that contacts the first contact and a second via that contacts the second contact.

17. The monolithic integrated circuit of claim 16, further comprising:
a top-level dielectric layer surrounding the first via and the second via; and
a third via with a top portion that is surrounded by the top-level dielectric layer;
wherein a bottom portion of the third via is physically connected to a wire in the interconnect layer; and
wherein the plurality of field effect transistors are complementary metaloxide-semiconductor field effect transistors.

18. The monolithic integrated circuit of claim 17, further comprising:
a second channel of a second radio-frequency phase change material switch, wherein the second channel of the second radio-frequency phase change material switch is formed over the insulator layer;
a control circuit that controls when the heating element heats the phase change material channel;
a single pole double throw switch comprising a first throw, a second throw, and the first and second radio-frequency phase change material switches; and
a signal bus configured to accept an external electrical connection;
wherein the first and second radio-frequency phase change material switches are both coupled to the signal bus;
wherein the first radio-frequency phase change material switch is coupled to the first throw;
wherein the second radio-frequency phase change material switch is coupled to the second throw; and
wherein the control circuit comprises the plurality of field effect transistors.

19. The monolithic integrated circuit of claim 18, further comprising:
a capacitor that supplies a set pulse to the heating element in response to a signal from the control circuit;
wherein the set pulse is delivered to the heating element in under 10 nanoseconds; and
wherein the first throw and the signal bus are at least three times as wide as the phase change material channel.

* * * * *